(12) United States Patent
Arndt et al.

(10) Patent No.: US 9,406,683 B2
(45) Date of Patent: Aug. 2, 2016

(54) WET BOTTLING PROCESS FOR SMALL DIAMETER DEEP TRENCH CAPACITORS

(71) Applicant: International Business Machines Corporation, Armonk, NY (US)

(72) Inventors: Russell H. Arndt, Fishkill, NY (US); Babar A. Khan, Ossining, NY (US); Byeong Y. Kim, Lagrangeville, NY (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/560,203

(22) Filed: Dec. 4, 2014

(65) Prior Publication Data

US 2016/0163711 A1 Jun. 9, 2016

(51) Int. Cl.
*H01L 27/01* (2006.01)
*H01L 27/108* (2006.01)
*H01L 49/02* (2006.01)
*H01L 21/84* (2006.01)
*H01L 21/306* (2006.01)
*H01L 21/02* (2006.01)
*H01L 21/28* (2006.01)

(52) U.S. Cl.
CPC ...... *H01L 27/1087* (2013.01); *H01L 21/02271* (2013.01); *H01L 21/28* (2013.01); *H01L 21/30604* (2013.01); *H01L 21/84* (2013.01); *H01L 27/10867* (2013.01); *H01L 28/60* (2013.01)

(58) Field of Classification Search
CPC ............... H01L 27/1087; H01L 21/84; H01L 29/66181; H01L 27/10829; H01L 29/945
See application file for complete search history.

(56) References Cited

U.S. PATENT DOCUMENTS

| 6,218,315 | B1 | 4/2001 | Ballamine et al. | |
|---|---|---|---|---|
| 6,265,268 | B1 | 7/2001 | Halliyal et al. | |
| 6,365,485 | B1 * | 4/2002 | Shiao ................ | H01L 27/1087 438/249 |
| 6,566,177 | B1 * | 5/2003 | Radens ............. | H01L 27/10864 257/E21.652 |
| 6,599,798 | B2 * | 7/2003 | Tews ................. | H01L 21/76205 257/E21.553 |
| 7,575,970 | B2 | 8/2009 | Ho et al. | |
| 7,713,814 | B2 * | 5/2010 | Cheng ............. | H01L 21/823807 257/E21.008 |
| 7,791,124 | B2 | 9/2010 | Cheng et al. | |
| 8,030,707 | B2 * | 10/2011 | Cheng .................... | H01L 21/84 257/296 |
| 8,455,327 | B2 | 6/2013 | Pei et al. | |
| 2006/0105536 | A1 * | 5/2006 | Cheng ............. | H01L 21/823807 438/386 |
| 2009/0230508 | A1 * | 9/2009 | Dyer ................... | H01L 21/3086 257/532 |
| 2009/0289291 | A1 * | 11/2009 | Cheng .................... | H01L 21/84 257/301 |

* cited by examiner

*Primary Examiner* — Jaehwan Oh
(74) *Attorney, Agent, or Firm* — Scully, Scott, Murphy & Presser, P.C.; Steven J. Meyers

(57) ABSTRACT

A method including forming a deep trench in a semiconductor-on-insulator substrate including an SOI layer directly on top of a buried oxide layer directly on top of a base substrate, masking only a top surface of the SOI layer and a sidewall of the SOI layer exposed within an upper portion of the deep trench with a dielectric material without masking any surface of the base substrate exposed within a lower portion of the deep trench, and forming a bottle shaped trench by etching the base substrate exposed in the lower portion of the deep trench selective to the dielectric material and the buried oxide layer.

20 Claims, 6 Drawing Sheets

WET BOTTLING PROCESS FOR SMALL DIAMETER DEEP TRENCH CAPACITORS

BACKGROUND

The present invention relates generally to deep trench capacitors fabricated in a semiconductor substrate, and, more particularly, to a modified wet bottling process for small diameter deep trench capacitors.

Deep trench capacitors are used in a variety of semiconductor chips for high areal capacitance and low device leakage. Typically, a deep trench capacitor provides a capacitance in the range from about 4 fF (femto-Farad) to about 120 fF. A deep trench capacitor may be employed as a charge storage unit in a dynamic random access memory (DRAM), which may be provided as a stand-alone semiconductor chip, or may be embedded in a system-on-chip (SoC) semiconductor chip. A deep trench capacitor may also be employed in a variety of circuit applications such as a charge pump or a capacitive analog component in a radio-frequency (RF) circuit.

Semiconductor-on-insulator (SOI) devices formed on an SOI substrate or on a hybrid substrate provide high performance in advanced semiconductor chips. In SOI devices, the capacitive coupling between a substrate and semiconductor devices is reduced by the presence of a buried insulator layer. By forming a deep trench capacitor in the SOI substrate, SOI logic devices such as SOI transistors and deep trench capacitors may be formed on the same SOI substrate, thereby enabling embedding of deep trench capacitors into the SOI substrate that also contain high performance SOI logic devices. Such embedded deep trench capacitors enable various functionality including embedded dynamic access memory (eDRAM) and other embedded electronic components requiring a capacitor.

Capacitance of a deep trench capacitor employed in the SOI substrate may be increased by forming a bottle shaped trench, which has a greater width at a bottom portion beneath a buried insulator layer than at an upper portion located at and above the buried insulator layer. Such a bottle shaped trench benefits from an increased surface area due to the shape of the trench, for example, the bottle shape, since the area of a node dielectric increases almost linearly with the width of the bottom portion of the deep trench, while consuming a minimal area in the upper portion so that use of the area of the top semiconductor layer by the deep trench capacitor is minimized.

For the manufacture of such a bottle shaped trench, however, it is necessary to protect adjoining portions of the top semiconductor layer around the upper portion of the deep trench during the expansion of the bottom portion of the deep trench to form a bottle shaped cavity and during the formation of the buried plate. In general, formation of a deep trench may be divided into two processing steps, between which a top semiconductor collar dielectric is formed on exposed sidewall surfaces of the top semiconductor layer. In one example, the collar dielectric may be typically formed by converting a sidewall of the top semiconductor layer, thus reducing the material of the top semiconductor layer that is available for formation of semiconductor devices. In another example, the collar dielectric may be typically formed by depositing a non-conformal dielectric layer within the deep trench and subsequently removing it from the lower portion. In another example, the collar dielectric may be typically formed by depositing a sacrificial material to fill a lower portion of the deep trench, followed by depositing a non-conformal dielectric layer within a remaining opening in the upper portion of the deep trench, subsequently removing a bottom portion of the collar dielectric and then removing the sacrificial material from the lower portion. In sum, protection of portions of the top semiconductor layer adjoining the deep trench requires multiple additional processing steps, thereby increasing processing complexity and cost.

SUMMARY

According to an embodiment of the present invention, a method is provided. The method may include forming a deep trench in a semiconductor-on-insulator substrate including an SOI layer directly on top of a buried oxide layer directly on top of a base substrate, masking only a top surface of the SOI layer and a sidewall of the SOI layer exposed within an upper portion of the deep trench with a dielectric material without masking any surface of the base substrate exposed within a lower portion of the deep trench, and forming a bottle shaped trench by etching the base substrate exposed in the lower portion of the deep trench selective to the dielectric material and the buried oxide layer.

According to an embodiment of the present invention, a method is provided. The method may include forming a deep trench in a semiconductor-on-insulator substrate including an SOI layer directly on top of a buried oxide layer directly on top of a base substrate, the deep trench including an upper portion aligned with the SOI layer and the buried oxide layer, and a lower portion aligned with the base substrate, depositing, anisotropically, a non-conformal dielectric layer directly on top of the semiconductor-on-insulator substrate using a high temperature high pressure CVD technique, the non-conformal dielectric layer covering a portion of a sidewall of the deep trench aligned with the SOI layer, while leaving the base substrate completely exposed, and enlarging a diameter or width of the lower portion of the deep trench by etching the base substrate selective to the non-conformal dielectric layer and the buried oxide layer to form a bottle shaped trench.

According to an embodiment of the present invention, a method is provided. The method may include forming a deep trench in a semiconductor-on-insulator substrate including an SOI layer directly on top of a buried oxide layer directly on top of a base substrate, the deep trench including an upper portion aligned with the SOI layer and the buried oxide layer, and a lower portion aligned with the base substrate, depositing, anisotropically, a non-conformal dielectric layer directly on top of the semiconductor-on-insulator substrate using a high temperature high pressure chemical vapor deposition technique, where the high temperature high pressure chemical vapor deposition technique includes a reaction temperature of at least 700° C., a pressure above atmospheric pressure, and a deposition reaction time no greater than 40 seconds, the non-conformal dielectric layer only covering a portion of a sidewall of the deep trench aligned with the SOI layer while leaving the base substrate completely exposed, and forming a bottle shaped trench by etching the base substrate exposed in the lower portion of the deep trench selective to the non-conformal dielectric layer and the buried oxide layer.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 1 depicts forming a deep trench in a substrate according to an exemplary embodiment.

FIG. 2 depicts depositing a non-conformal dielectric layer according to an exemplary embodiment.

FIG. 3 depicts etching an exposed portion of the base substrate 106 according to an exemplary embodiment.

FIG. 4 depicts forming deep trench capacitor according to an exemplary embodiment.

FIG. 5 depicts recessing the inner electrode according to an exemplary embodiment.

FIG. 6 depicts the final deep trench capacitor structure according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
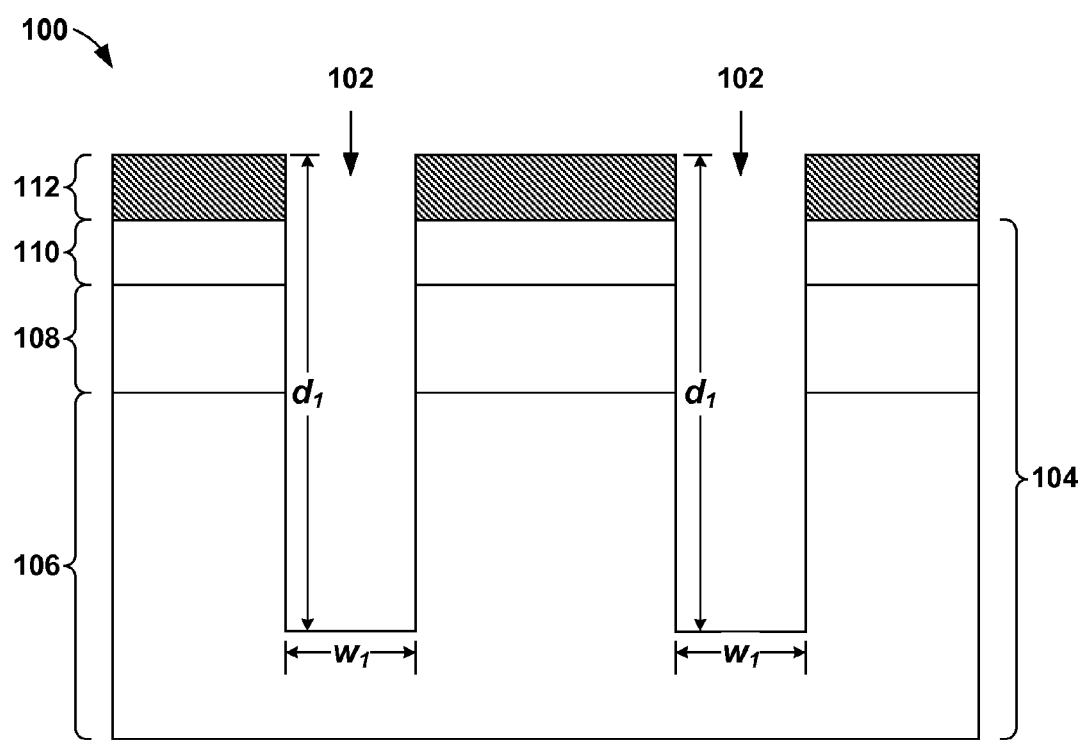
FIGS. 1-6 illustrate the steps of a method of a wet bottling process for small diameter deep trench capacitors.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The size or diameter of a deep trench capacitor continues to shrink or decrease as technology nodes continue to decrease. As the diameter of a deep trench capacitor decreases so does its depth as a consequence of the limitations of the lithography and the aspect ratio. A decrease in depth may also correspond to a decrease in capacitance. One way to limit any decrease in capacitance may include changing the dielectric insulating layer separating the anode from the cathode. Another way to limit any decrease in capacitance may include a wet bottling process used to increase or enlarge the effective diameter of a lower portion of the deep trench capacitor below a buried oxide layer.

Unfortunately, current decreases in technology nodes makes current wet bottling techniques unusable because the collar dielectric used to protect the top semiconductor layer has to be etched off in the capacitor region prior to wet bottling. As the trench dimensions get smaller, it is not possible to etch the dielectric off in the capacitor region without degrading the collar and thus prevent the wet etching chemistry from enlarging damaging the region above the buried oxide layer that we need to protect. The above wet bottling process may be unusable for nodes smaller than or equal to about 32 nm.

The present invention relates generally to deep trench capacitors fabricated in a semiconductor substrate, and, more particularly, to a modified wet bottling process for small diameter deep trench capacitors. The shape and diameter of a deep trench capacitor used in small technology nodes may be modified to effectively increase its capacitance. One way to modify the deep trench capacitor to increase its capacitance for use in small technology nodes may include using a modified wet bottling process. One way to fabricate the modified deep trench capacitor using the modified wet bottling process is described in detail below by referring to the accompanying drawings FIGS. 1-6. More specifically, a deep trench may be etched into a semiconductor-on-insulator substrate, an anisotropic spacer layer may be deposited to protect only the SOI layer, and a diameter of a lower portion of the deep trench may be increased using a wet etching technique.

Referring now to FIGS. 1-6, exemplary process steps of forming a modified deep trench capacitor (hereinafter "modified DT capacitor") in accordance with an embodiment of the present invention are shown, and will now be described in greater detail below. It should be noted that FIGS. 1-6 all represent a cross section view of a semiconductor structure 100 ("structure") depicting the fabrication of two modified DT capacitors. Two modified deep trench capacitors are depicted for illustrative purposes only and the following description may apply to any number or combination of modified capacitors.

Referring now to FIG. 1, a deep trench 102 may be formed in a semiconductor-on-insulator substrate 104 (hereinafter "SOI substrate"). The SOI substrate 104 may include a base substrate 106, a buried oxide layer 108 (hereinafter "BOX layer") formed on top of the base substrate 106, and an SOI layer 110 formed on top of the BOX layer 108. The BOX layer 108 electrically insulates the SOI layer 110 from the base substrate 106. In addition, the SOI substrate 104 may have a pad dielectric layer 112 formed on a top surface of the SOT layer 110. The base substrate 106 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g.

III-V and II-VI) semiconductor materials. Non-limiting examples of compound semiconductor materials include gallium arsenide, indium arsenide, and indium phosphide. Typically the base substrate 106 may be about, but is not limited to, several hundred microns thick. For example, the base substrate 106 may include a thickness ranging from 0.5 mm to about 1.5 mm.

The BOX layer 108 may be formed from any of several dielectric materials. Non-limiting examples include, for example, oxides, nitrides and oxynitrides of silicon. Oxides, nitrides and oxynitrides of other elements are also envisioned. In addition, the BOX layer 108 may include crystalline or non-crystalline dielectric material. Moreover, the BOX layer 108 may be formed using any of several methods. Non-limiting examples include ion implantation methods, thermal or plasma oxidation or nitridation methods, chemical vapor deposition methods and physical vapor deposition methods. In an embodiment, the BOX layer 108 may be about 150 nm thick. Alternatively, the BOX layer 108 may have a thickness ranging from about 10 nm to about 500 nm. The BOX layer may alternatively be referred to as a buried insulator layer.

The SOI layer 110 may include any of the several semiconductor materials included in the base substrate 106. In general, the base substrate 106 and the SOI layer 110 may include either identical or different semiconducting materials with respect to chemical composition, dopant concentration and crystallographic orientation. In an embodiment, the base substrate 106 and the SOI layer 110 may include semiconducting materials that include at least different crystallographic orientations. Typically the base substrate 106 or the SOI layer 110 include a {108} crystallographic orientation and the other of the base substrate 106 or the SOI layer 110 includes a {100} crystallographic orientation. Typically, the SOI layer 110 may have a thickness ranging from about 5 nm to about 100 nm. Methods for making the SOI layer 110 are well known in the art. Non-limiting examples include SIMOX (Separation by Implantation of Oxygen), wafer bonding, and ELTRAN® (Epitaxial Layer TRANsfer).

The pad dielectric layer 112 may include an insulating material such as, for example, silicon nitride. The pad dielectric layer 112 may be formed using conventional deposition methods, for example, low pressure chemical vapor deposition (LPCVD), rapid thermal chemical vapor deposition (RTCVD), plasma enhanced chemical vapor deposition (PECVD), and high density plasma chemical vapor deposition (HDPCVD). The pad dielectric layer 112 may have a thickness ranging from about 10 nm to about 500 nm. In an embodiment, the pad dielectric layer 112 may be about 100 nm thick. Optionally, a thin (2 nm to 10 nm, preferably 5 nm) thermal oxide layer (not shown) may be formed on the SOI layer 110 prior to forming the pad dielectric layer 112.

The deep trench 102 may be formed using known patterning techniques, such as for example, a lithography technique followed by an etching technique. The term "deep trench" denotes a trench formed in a semiconductor substrate having a sufficient depth to form a capacitor. As such, a deep trench may typically denote a trench having a depth equal to or greater than 1 μm, whereas a shallow trench may typically refer to a trench having a depth less than 1 μm. While the present embodiment may be described with a deep trench, the present embodiment may be employed with a trench having any depth into the SOI substrate 104. Such variations are explicitly contemplated herein. More specifically, the deep trench 102 may have substantially vertical sidewalls extending from the top surface of the pad dielectric layer 112 through the SOI layer 110 and the BOX layer 108, and into the base substrate 106.

In an embodiment, the deep trench 102 may have a depth ($d_1$) of about 3 μm and a width ($w_1$) equal to or less than about 55 nm, and more preferably less than 90 nm. As technology shrinks there is no room left for larger trench diameters. In one embodiment, the deep trench 102 may have an aspect ratio of approximately 50:1. Stated differently the deep trench 102 may have a depth ($d_1$) approximately 50 times larger than its width ($w_1$). In general, the deep trench 102 may have dimensions corresponding to a 22 nm technology node (for example a diameter of 90 nm), a 14 nm technology node (for example a diameter of 85 nm), or smaller. The deep trench 102 may include an upper portion and a lower portion. The upper portion of the deep trench 102 may generally refer to a portion of the deep trench 102 that is aligned with the SOI layer 110 and the BOX layer 108. Stated differently, the upper portion of the deep trench 102 may refer to a portion of the deep trench 102 that is above the base substrate 106. Conversely, the lower portion of the deep trench 102 may generally refer to a portion of the deep trench 102 that is aligned with the base substrate 106. Stated differently, the lower portion of the deep trench 102 may refer to a portion of the deep trench 102 that is below the BOX layer 108.

The lithography technique may include applying a photoresist (not shown) to an upper surface of the pad dielectric layer 112, exposing the photoresist to a desired pattern of radiation and developing the exposed photoresist utilizing a conventional resist developer. The pattern in the photoresist may then be transferred to the pad dielectric layer 112 and the SOI substrate 104 using one or more dry etching techniques to form the deep trench 102. Suitable dry etching techniques may include, but are not limited to: reactive ion etching (RIE), ion beam etching, plasma etching, or laser ablation. The patterned photoresist may then be removed by resist stripping after etching has been completed. In an embodiment, an optional hard mask layer, such as an oxide (not shown), may be deposited on top of the pad dielectric layer 112 to facilitate the formation of the deep trench. The hard mask layer may generally be removed after the formation of the deep trench 102.

Figure 2:
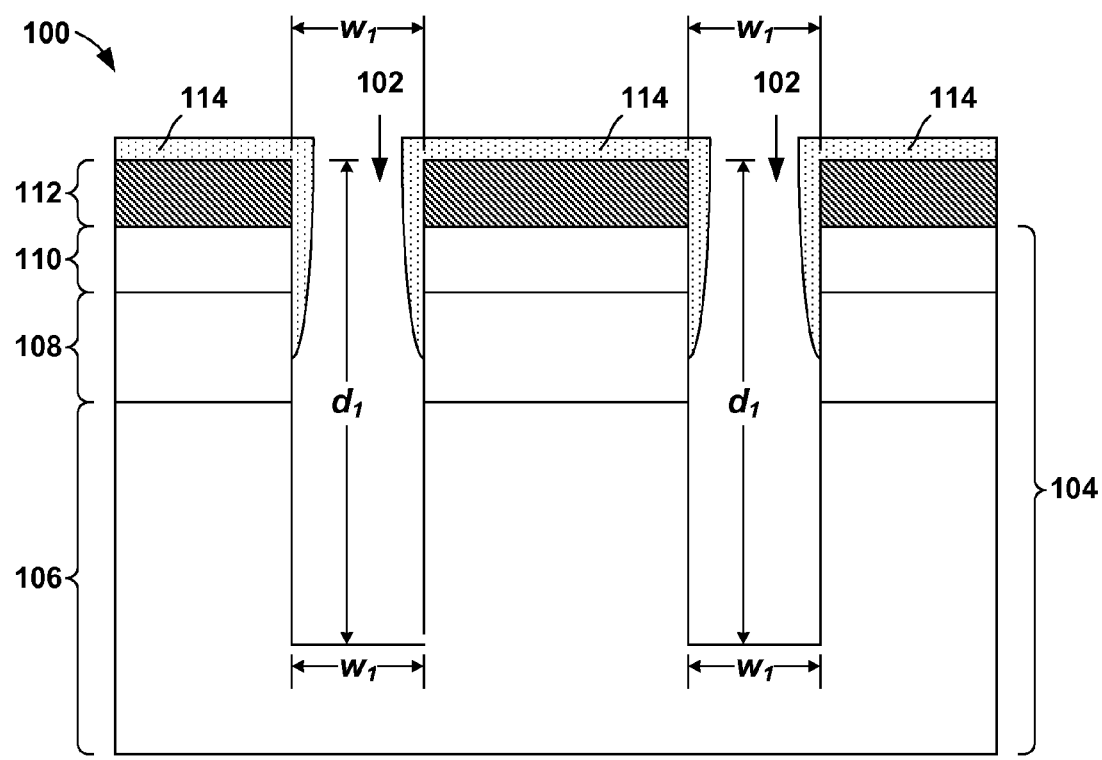

Referring now to FIG. 2, a non-conformal dielectric layer 114 may be deposited on top of the structure 100, as illustrated. More specifically, the non-conformal dielectric layer 114 may only be deposited on an upper surface of the pad dielectric layer 112 and along a sidewall of the upper portion of the deep trench 102. As described above, the sidewall of the upper portion of the deep trench 102 may include an exposed sidewall of the SOI layer 110 and an exposed sidewall of the BOX layer 108. Preferably, the non-conformal dielectric layer 114 is not deposited in the lower portion of the deep trench 102, and as such is not deposited on any part of the base substrate 106 to etch the material of the base substrate 106.

In general, the non-conformal dielectric layer 114 may include any known material that which may protect the sidewall of the SOI layer 110 during a subsequent etching technique.

In an embodiment, as illustrated, the non-conformal dielectric layer 114 may not cover any portion of the base substrate 106 and may preferably cover the entire sidewall of the SOI layer 110. In another embodiment, the non-conformal dielectric layer 114 may extend far enough along the sidewall of the deep trench to completely cover both the SOI layer 110 and the BOX layer 108, and, in some cases, cover a small portion of the base substrate 106.

It is an object of the present embodiment that the base substrate 106 remain completely exposed an unobstructed by the non-conformal dielectric layer 114. More specifically, it is a critical feature of the present embodiment that the base substrate 106 remain completely exposed and unobstructed by the non-conformal dielectric layer 114 to allow for subsequent etching and widening to form a bottle shaped trench as described below with reference to FIG. 3. In an embodiment, the lateral thickness of the non-conformal dielectric layer 114 with the upper portion of the deep trench 102 may decrease to zero before reaching the base substrate 106, as illustrated.

The non-conformal dielectric layer 114 may be formed by a non-conformal deposition of a dielectric material. Such a non-conformal deposition of the dielectric material may be effected by a depletive chemical vapor deposition (CVD) in which the deposition rate of the dielectric material is limited by supply of reactants in addition to the time, temperature and pressure of the reaction. When reactants are depleted in a chemical vapor deposition process, the thickness of the deposited material depends on the proximity of the surface at which deposition is made to the source of reactant supply. More dielectric material is deposited on a surface close to the source of the reactant supply than on a surface removed from the source of the reactant supply by a distance. For example, the closer a position on the sidewalls of the deep trench 102 to the top surface of the pad dielectric layer 112, the thicker the non-conformal dielectric layer 114 is at that position. Therefore, a lateral thickness of the non-conformal dielectric layer 114 deposited along the sidewall of the deep trench 102 may decrease as the distance from the top surface of the pad dielectric layer 112 increases. Normally increasing the process temperature would substantially increase the reaction rate risking depositing too much dielectric material such that pinch off occurs at or near a top of the deep trench. Pinch off is undesirable and it may inhibit subsequent processing.

As such, the portion of the non-conformal dielectric layer 114 deposited along the sidewall of the upper portion of the deep trench 102 may have a thickness that decreases with distance from the top surface of the pad dielectric layer 112. Typically, as the distance from the top surface of the pad dielectric layer 112 increases, the thickness of the non-conformal dielectric layer 114 decreases. The thickness of the non-conformal dielectric layer 114 may become zero at or above a boundary between the upper portion of the deep trench 102 and the lower portion of the deep trench 102. This boundary is generally located at or near the interface between the BOX layer 108 and the base substrate 106. The lateral thickness of the non-conformal dielectric layer 114 measured at the top of the deep trench 102 is less than the width of the deep trench 102 to prevent filling of the deep trench 102 by the non-conformal dielectric layer 114. Optionally, the non-conformal dielectric layer 114 can be densified, for example, by a thermal annealing technique.

It is a critical feature of the present embodiment that the lateral thickness of the non-conformal dielectric layer 114 preferably decrease to zero before reaching the base substrate 106, as illustrated. More specifically, it is a critical feature of the present embodiment that the thickness of the non-conformal dielectric layer 114 preferably decrease to zero before reaching the base substrate 106 and no amount of dielectric material is deposited below the BOX layer 108. The vertical thickness of the non-conformal dielectric layer 114 directly above the pad dielectric layer 112 may be substantially uniform. In an embodiment, the vertical thickness of the non-conformal dielectric layer 114 may range from about 1 nm to about 10 nm. In another embodiment, the non-conformal dielectric layer 114 may be an oxide layer having a vertical thickness ranging from about 1 nm to about 10 nm. For example, oxides may be used because of their positive etch selectivity with semiconductor materials of the base substrate 106.

Exemplary depletive CVD processes include, but are not limited to high temperature higher pressure CVD (HPHT CVD), plasma enhanced chemical vapor deposition (PECVD), high density plasma chemical vapor deposition (HDPCVD), rapid thermal chemical vapor deposition. Higher pressure is roughly defined as pressure greater than tens of Torr. The dielectric material of the non-conformal dielectric layer 114 may be silicon dioxide, undoped silicate glass (USG), borosilicate glass (BSG), phosphosilicate glass (PSG), arsenosilicate glass (ASG), borophosphosilicate glass (BPSG), silicon nitride, silicon oxynitride, and a combination thereof. The various silicate glass materials may be deposited employing tetra-ortho-ethyl-silicate (TEOS) as a precursor. Ozone environment may be provided to deposit a silicate glass material with the TEOS as the precursor to deposit an "ozone TEOS" oxide material. Another exemplary processes is an ozone TEOS process that forms an undoped silicate glass (USG) material.

In an embodiment, the non-conformal dielectric layer 114 may be formed using an HPHT CVD technique. The HPHT CVD technique may be used to deposit silicon dioxide, silicon nitride or silicon oxynitride using a silane or dichlorosilane and ammonia precursor. In particular, the HPHT CVD technique may be carried out at a temperature higher than about 700° C. and a pressure higher than atmosphere. Typically, low pressure techniques may be used to provide good conformal step coverage, for example, depositing a node dielectric; however, a typical low pressure CVD technique would normally deposit material on the base substrate 106 within the lower portion of the deep trench 102. Additionally, the HPHT CVD technique will produce a thinner layer along the sidewall of the SOI layer 110 than a comparable dielectric layer formed with a typical CVD technique. In general, HPHT deposition techniques are extremely anisotropic and have very poor conformal step coverage and are typically used when deposition of a particular material is required on a top surface only and not along any vertical sidewall, and thus would not typically be used to achieve the disclosed results. Furthermore, HPHT techniques are not typically used to deposit dielectric materials, such as oxide or nitrides. Exemplary process data for a 200T deposition process is reproduced below in Table 1 below.

TABLE 1

| HPHT CVD Process Details | | | | | | | | |
|---|---|---|---|---|---|---|---|---|
| | Step Name | Step end control | Max step time | Pressure (Torr) | Temp | Temp Ramp | Heater spacing | Gases & Flow rates |
| Step 1 | Set | by time | 2 s | throttle fully open | 750° C. | 0.10° C./s | 1700 mils | na |
| Step 2 | stabilize | by time | 5 s | throttle fully open | 750° C. | 0.10° C./s | 550 mils | na |

TABLE 1-continued

HPHT CVD Process Details

| Step Name | Step end control | Max step time | Pressure (Torr) | Temp | Temp Ramp | Heater spacing | Gases & Flow rates |
|---|---|---|---|---|---|---|---|
| Step 3 | gas on | by time | 5 s | throttle fully open | 750° C. | 0.10° C./s | 550 mils | N2 Dep1: 10000 sccm<br>N2 Clean: 2000 sccm<br>N2 Purge 8000 sccm |
| Step 4 | heat up | by time | 40 s | servo 200T | 750° C. | 0.10° C./s | 550 mils | N2 Dep1: 10000 sccm<br>N2 Clean: 2000 sccm<br>N2 Purge 8000 sccm |
| Step 5 | PRE-DEP N2O | by time | 10 s | servo 200T | 750° C. | 0.10° C./s | 550 mils | N2 Dep1: 10000 sccm<br>N2 Clean: 2000 sccm<br>SiH4 low: 2 dmp<br>N2O: 3000 sccm<br>N2 Purge 8000 sccm |
| Step 6 | Deposition | by time | approx 30 s | servo 200T | 750° C. | 0.10° C./s | 550 mils | N2 Dep1: 10000 sccm<br>N2 Clean: 2000 sccm<br>SiH4 low: 4 sccm<br>N2O: 3000 sccm<br>N2 Purge 8000 sccm |
| Step 7 | Purge | by time | 5 s | throttle fully open | 750° C. | 0.10° C./s | 750 mils | N2 Dep1: 10000 sccm<br>N2 Clean: 2000 sccm<br>N2 Purge 8000 sccm |
| Step 8 | Set | by time | 2 s | throttle fully open | 750° C. | 0.10° C./s | 1700 mils | na |

With reference to Table 1, an exemplary non-conformal dielectric layer like the one illustrated in FIGS. 2-6 containing a high temperature oxide of the present invention was prepared. The high temperature oxide was prepared in accordance with the HPHT CVD process described above. Table 1 contains the process details for this 200 Torr deposition process. Specifically, the deposition process is step 6 of the process reproduced in Table 1. It should be noted that the deposition process must not be so non-conformal that it does not completely coat the top side of the trench above the BOX layer 108. It also must not be so conformal that it coats the trench substantially below the BOX layer 108. The process of Table 1 is optimized by adjusting the flow rate, time, pressure and temperature to achieve the desired results. The optimized process conditions which produce the desired result as described above and illustrated in FIGS. 2-6 are shown in Table 1 above.

Using this optimized process, a small amount of dielectric material deposits along the sidewall of upper portion of the deep trench 102 when using the HPHT CVD technique and relatively short reaction times to deposit the non-conformal dielectric layer 114. Such results were not thought to be possible before this experiment.

Standard LPCVD techniques lead to deposition of the dielectric inside the deeper part of the deep trench. Higher Pressure CVD (>10 T) is less conformal, but must be optimized to deposit enough material on the top sidewall of the trench above the BOX layer 108 without pinching off the deep trench at the top and without depositing material below the BOX layer 108.

It should be noted that using the above technique will eliminate the need to partially fill the deep trench with a sacrificial material to prevent deposition of the dielectric material below the BOX layer 108. It should also be noted that because the non-conformal dielectric layer 114 is not deposited on any exposed surface of the base substrate 106, using the above technique may also eliminate the need to subsequently remove any portion of the non-conformal dielectric layer 114 from any surface of the base substrate 106.

Figure 3:
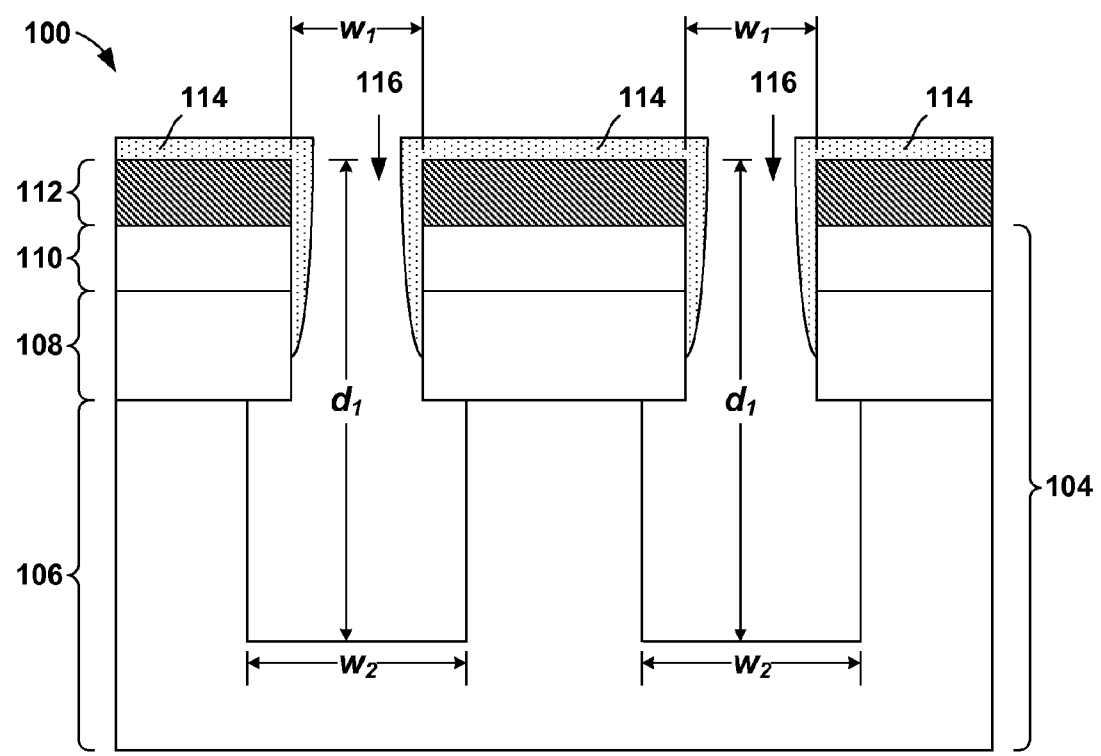

Referring now to FIG. 3, using the non-conformal dielectric layer 114 as an etch mask, the exposed portion of the base substrate 106 may be enlarged or expanded by etching. More specifically, a portion of the semiconductor material of the base substrate 106 may be removed from beneath the bottom surface of the BOX layer 108, selective to the non-conformal dielectric layer 114. The portion of the semiconductor material of the base substrate 106 may be removed using any known isotropic etching technique, for example, a wet etch. Etch chemistries capable of removing the portion of the semiconductor material of the base substrate 106 are known in the art. In an embodiment, for example, an etching solution containing tetramethyl ammonium hydroxide (TMAH) or ammonia hydroxide can be used to etch the base substrate 106.

As the portion of the base substrate 106 is removed, the bottom portion of the deep trench 102 enlarges or expands, thereby transforming the deep trench 102 having substantially vertical sidewalls into a bottle shaped trench 116. It should be noted that the top and bottom portions of the deep trench 102 correspond with a top portion and a bottom portion of the bottle shaped trench 116, respectively. After etching, a width of the bottom portion of the bottle shaped trench 116 is greater than the width of the top portion of the bottle shaped trench 116. Stated differently, the sidewalls of the bottom portion of the bottle shaped trench 116 are spaced farther apart than sidewalls of the top portion of the bottle shaped trench 116. More specifically, a width ($w_2$) of the bottom portion of the bottle shaped trench 116 is greater than the width ($w_1$) of the top portion. The sidewalls of the bottom portion of the bottle shaped trench 116 underlie the BOX layer 108, the SOI layer 110, and the pad dielectric layer 112. Further, the sidewalls of the top portion of the bottle shaped trench 116, which include sidewalls of the BOX layer 108, the SOI layer 110, and the pad dielectric layer 112, overlie the cavity of the bottom portion of the bottle shaped trench 116. The distance (r) of the lateral recess of the sidewalls of the bottom portion relative to the sidewalls of the top portion may range from about 10 nm to about 150 nm, and typically from about 20 nm to about 100 nm, although lesser and greater distances are also contemplated herein.

Figure 4:
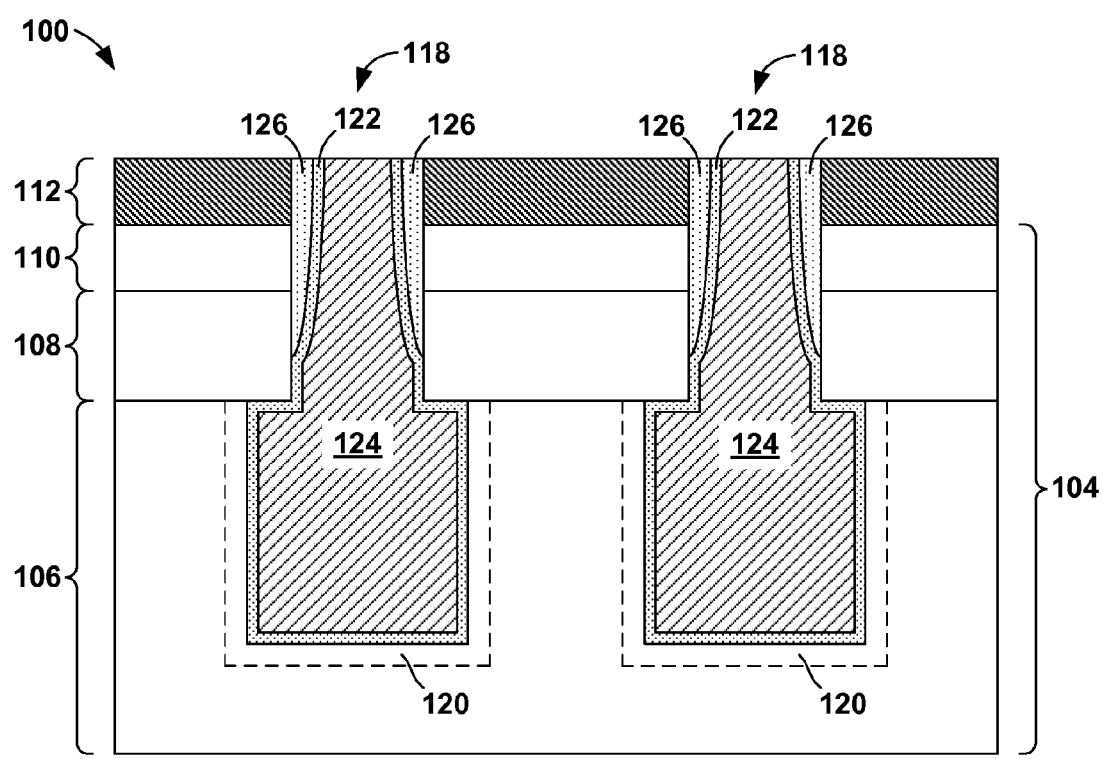

Referring now to FIG. 4, a deep trench capacitor 118 may be fabricated in the bottle shaped trench 116 according to known conventional process techniques, as described below. First, a buried capacitor plate 120 may be formed by introducing a dopant of a first conductivity type through the sidewalls and the bottom surface of the bottom portion of the bottle shaped trench 116, or otherwise into a portion of the base substrate 106. The first conductivity may be the same as, or be the opposite of, a second conductivity type. For example, the first conductivity type may be p-type and the second conductivity type may be n-type, or vice versa. Alternatively, both the first conductivity and the second conductivity may be n-type or p-type. Examples of the dopants include B, Ga, In, P, As, Sb, etc. The dopants may be introduced by ion implantation, gas phase doping, plasma doping, plasma immersion ion implantation, cluster doping, infusion doping, liquid phase doping, or solid phase doping such as outdiffusion from a dopant containing material such as arsenosilicate glass (ASG), borosilicate glass (BSG), phosphosilicate glass (PSG), etc. The lateral width of the buried capacitor plate 120 may range from about 10 nm to about 400 nm, and typically from about 50 nm to about 200 nm, although lesser and greater widths are contemplated herein. The dopant concentration of the buried capacitor plate 120 may range from about $1.0 \times 10^{17}/cm^3$ to about $1.0 \times 10^{21}/cm^3$, and typically from about $1.0 \times 10^{18}/cm^3$ to about $1.0 \times 10^{20}/cm^3$. The formation of the buried capacitor plate 120 can be performed before or after the expansion of the lower portion of the deep trench. In addition the non-conformal dielectric layer 114 may also protect the SOI layer 110 and the BOX layer 108 during the implantation process used to form the buried capacitor plate 120.

Next, the bottle shaped trench 116 may be lined with a node dielectric 122, as illustrated. The node dielectric 122 may typically have a thickness of about 2 nm to about 10 nm. The node dielectric 122 may be conformally formed along the walls of the bottle shaped trench 116 (FIG. 3) using any known deposition technique such as, for example, thermal oxidation, thermal nitridation, chemical oxidation, chemical vapor deposition (CVD), atomic layer deposition (ALD) or any suitable combination thereof. The node dielectric 122 may be, for example, silicon oxide, silicon nitride, silicon oxynitride, high-k materials, or any combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.5 to about 3 and each value of y may independently range from 0 to about 2

A conductive material may be deposited above the structure 100 and within the bottle shaped deep trench 116 to form an inner electrode 124. The conductive material may be deposited directly on top of the pad dielectric layer 112 and directly on top of the node dielectric 122 within the deep trench. Preferably, the conductive material fills the deep trench to form the inner electrode 124; however in some case a void may form near the middle of the inner electrode 124 due to the high aspect ratio of the deep trench. The conductive material layer may then be planarized or polished using the pad dielectric layer 112 as a stopping layer. The planarization step may employ a chemical mechanical planarization (CMP) technique or an etching technique. During or after the planarization step, portions of the non-conformal dielectric layer 114 and the node dielectric layer 122 above the pad dielectric layer 112 are also removed. The remaining portion of the conductive material constitutes the inner electrode 124. The remaining portion of the non-conformal dielectric layer 114 constitutes a dielectric spacer 126, and is confined within the area of the top portion of the bottle shaped trench 116 and has a shape that is similar to a tube or a ring. A top surface of the inner electrode 124, a top surface of the node dielectric 122, and a top surface of the dielectric spacer 126 are substantially flush with the top surface of the pad dielectric layer 112. The conductive material include a polycrystalline or amorphous doped semiconductor material and/or a metallic material.

Exemplary metallic materials include, but are not limited to, transition elements (i.e., elements in group III B, group IV B, group V B, group VI B, group VII B, group VIII B, Lanthanides, and Actinides), Al, Ga, In, Tl, Sn, Pb, Bi, an alloy thereof, a conductive nitride thereof, or an alloy of conductive nitrides thereof. For example, the metallic inner electrode may include Ti, Ta, W, Cu, Co, TiN, TaN, WN, etc. The metallic material may be deposited by chemical vapor deposition (CVD), physical vapor deposition (PVD), atomic layer deposition, or alternatively by electro-deposition. It should be noted that a seed layer may be require when using an electro-deposition technique.

Exemplary polycrystalline or amorphous doped semiconductor materials include, but are not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, other compound semiconductor materials, and/or alloys thereof. The polycrystalline or amorphous doped semiconductor layer may have a doping of the first conductivity type or the second conductivity type, i.e., p-type or n-type. The dopant concentration of the polycrystalline or amorphous doped semiconductor layer may be from about $1.0 \times 10^{19}/cm^3$ to about $5.0 \times 10^{21}/cm^3$, and typically from about $3.0 \times 10^{19}/cm^3$ to about $5.0 \times 10^{20}/cm^3$, although lesser and greater dopant concentrations are also contemplated herein. The polycrystalline or amorphous doped semiconductor material may be formed by chemical vapor deposition (CVD), physical vapor deposition (PVD), atomic layer deposition, etc. The doping of the polycrystalline or amorphous doped semiconductor layer may be effected by in-situ doping, or by layered doping in which at least one layer of dopants is incorporated within the polycrystalline or amorphous doped semiconductor layer during deposition.

Figure 5:
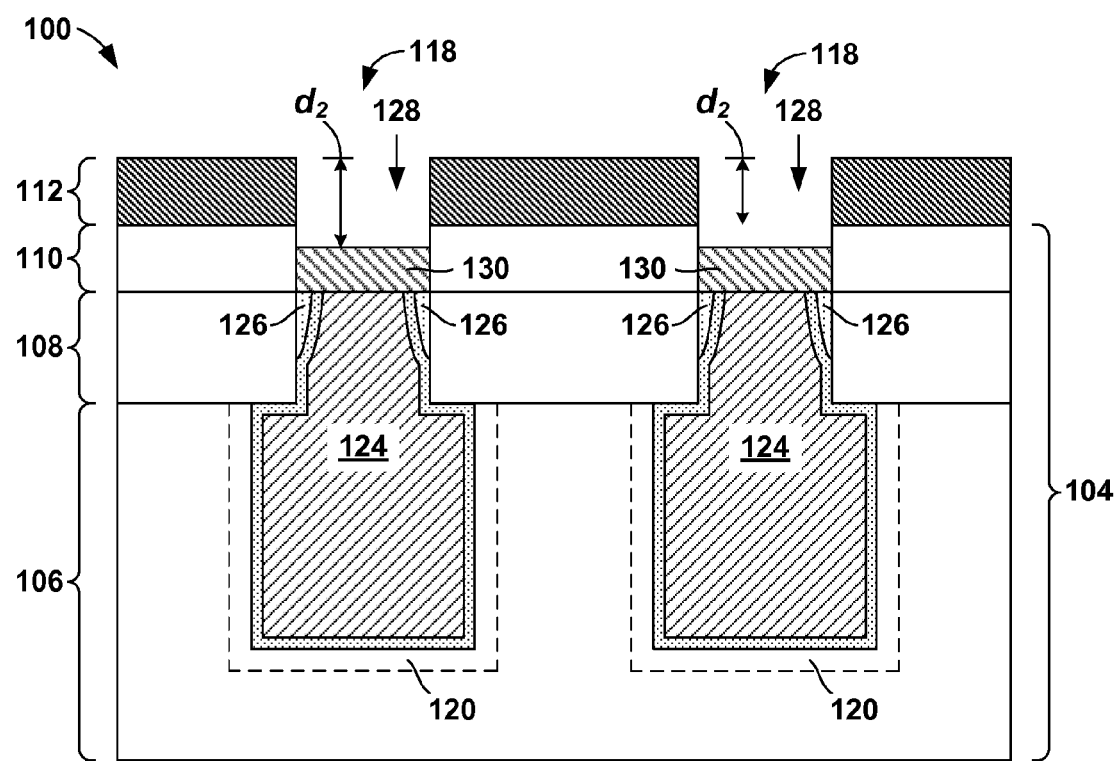

Referring to FIG. 5, the inner electrode 124 may then be recessed relative to the top surface of the pad dielectric layer 112 using a recess etch selective to the material of the pad dielectric layer 112. In doing so, portions of the node dielectric 122 and the dielectric spacer 126 are removed to form a recess 128. The inner electrode 124, the node dielectric 122, and the dielectric spacer 126 are recessed to a recess depth ($d_2$). More specifically, the inner electrode 124 and the node dielectric 122 may be recessed to a depth approximately equal to or below the intersection between the SOI layer 110 and the BOX layer 108; however, the exact depth is not critical so long as it is not below the BOX layer 108. The remaining portion of the dielectric spacer 126 constitutes a graded thickness dielectric collar extending from the recess depth ($d_2$) to a depth above the bottom surface of the BOX layer 108. The dielectric spacer 126 may have a thickness that monotonically decreases with the distance from the recess depth ($d_2$), as illustrated. Typically, the thickness of the dielectric spacer 126 strictly decreases with the distance from the recess depth ($d_2$). It should be noted that the top surface of the inner electrode 124, the top surface of the node dielectric 122, and the top surface of the dielectric spacer 126 are substantially flush among one another at this step. As described above, the recess 128 is formed above the top surface of the inner electrode 124 within the top portion of the bottle shaped trench 116.

In an embodiment, the inner electrode 124 may be conventionally recessed, for example, using a RIE technique and then the node dielectric 122 and the dielectric spacer 126 may be recessed by wet etching with hydrofluoric acid, phosphoric acid or a mixture of hydrofluoric acid and ethylene glycol.

Next, a conductive buried strap 130 may be formed by filling the recess 128 with a conductive material according to known techniques. The conductive buried strap 130 may include a polycrystalline or amorphous doped semiconductor material and/or a metallic material, similar to the inner electrode 124 described in detail above. Furthermore, similar processing steps as described above with reference to the inner electrode 124 may be used to form the conductive buried strap 130. In cases where the inner electrode 124 and the conductive buried strap 130 both include a doped semiconductor material, the doping types of the inner electrode 124 and the conductive buried strap 130 may preferably be matched. For example, are both the inner electrode 124 and the conductive buried strap 130 may include either p-type dopants or both n-type dopants. The conductive buried strap 130 directly contacts and may provide an electrically conductive path between the inner electrode 124 and the SOI layer 110.

Figure 6:
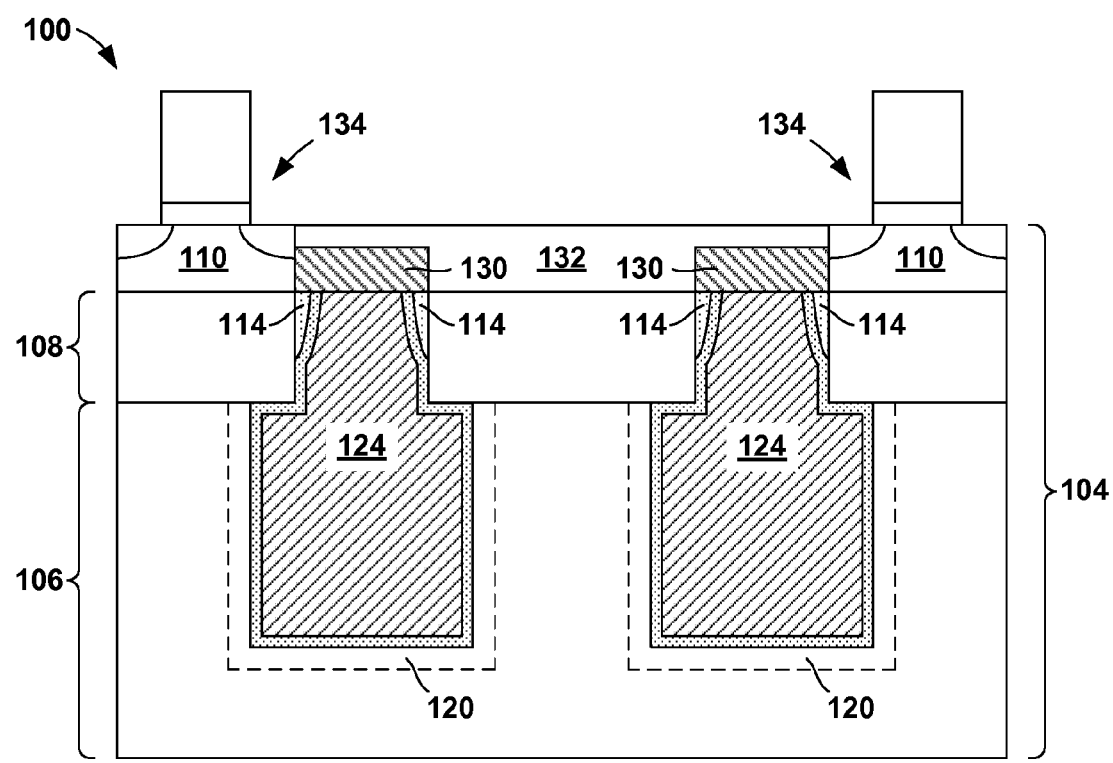

Referring now to FIG. 6, the remaining steps necessary to form, for example, a DRAM or an embedded DRAM memory cell structure are described. While these steps are not germane to the present invention, they are described for completeness. A shallow trench isolation (STI) region 132 may be formed and the pad dielectric layer 112 (FIG. 4) may be removed. In some cases, a portion of the conductive buried strap 130 may also be removed, for example, during the process of etching the STI region 132, and then filled with the same insulator as that used for filling the STI region 132, to form the final conductive buried strap 130. Then a transistor 134 may be formed nearby according to conventional techniques to complete the memory cell.

In embedded DRAM applications the physical size of the capacitor affects its functionality and capacitance. The wet bottling technique described above may be used to achieve at least a 10% increase in capacitance, and may be implemented in technology nodes below 22 nm. In the embodiment described above, the non-conformal dielectric layer 114 is deposited to protect the sidewall of the SOI layer 110 after the deep trench 102 (FIG. 2) is etched. Therefore, the required depth of the deep trench 102 may be achieve because the non-conformal dielectric layer is not yet present and cannot prevent or limit etching the deep trench to a desired depth. Additionally, the non-conformal techniques described above may be specifically designed and tuned to leave the base substrate 106 un-protected thus eliminating the need for an additional etch or removal step to expose the base substrate 106. As such, the wet etching technique used to create the bottle shape may be performed immediately after deposition of the non-conformal dielectric layer 114. Furthermore, the non-conformal deposition techniques described above may also eliminate the need for filling the lower portion of the deep trench 102 with a sacrificial material to prevent the dielectric material from depositing on the base substrate 106.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A method comprising:
forming a deep trench in a semiconductor-on-insulator substrate comprising an SOI layer directly on top of a buried oxide layer directly on top of a base substrate;
masking a top surface of the SOI layer and an entirety of a sidewall of the SOI layer exposed within an upper portion of the deep trench with a dielectric material, wherein a bottommost surface of the dielectric material in the deep trench is located above an interface between the buried oxide layer and the base substrate; and
forming a bottle shaped trench by etching the base substrate exposed in the lower portion of the deep trench selective to the dielectric material and the buried oxide layer.

2. The method of claim 1, wherein forming the bottle shaped trench is performed sequentially following masking only the top surface and the sidewall of the SOI layer with the dielectric material.

3. The method of claim 1, wherein the deep trench comprises an aspect ratio of 50:1 in which a depth is 50 times larger than a diameter or a width of the upper portion of the deep trench.

4. The method of claim 1, wherein the deep trench comprises a width or diameter less than about 55 nm.

5. The method of claim 1, further comprising:
forming a buried capacitor plate in the base substrate by introducing dopant through a side and a bottom surface of the lower portion of the bottle shaped trench;
forming a node dielectric by conformally depositing a dielectric material along an entire sidewall of the bottle shaped trench and the bottom surface of the bottle shaped trench; and
forming an inner electrode directly on top of the node dielectric substantially filling the bottle shaped trench.

6. The method of claim 1, further comprising:
forming a buried capacitor plate in the base substrate by introducing dopant of a second conductivity type through a sidewall and a bottom surface of the lower portion of the bottle shaped trench;
forming a node dielectric by conformally depositing a dielectric material along an entire sidewall of the bottle shaped trench and the bottom surface of the bottle shaped trench;
forming an inner electrode directly on top of the node dielectric substantially filling the bottle shaped trench; and
forming a buried strap to electrically connect an inner electrode of the deep trench capacitor with a source region of a nearby transistor.

7. The method of claim 1, further comprising:
forming a deep trench capacitor within the deep trench; and
forming a buried strap to electrically connect an inner electrode of the deep trench capacitor with a source region of a nearby transistor.

8. A method comprising:
forming a deep trench in a semiconductor-on-insulator substrate comprising an SOI layer directly on top of a buried oxide layer directly on top of a base substrate, the deep trench comprising an upper portion aligned with the SOI layer and the buried oxide layer, and a lower portion aligned with the base substrate;
depositing, anisotropically, a non-conformal dielectric layer directly on top of the semiconductor-on-insulator substrate using a high temperature high pressure CVD technique, the non-conformal dielectric layer covering an entirety of a sidewall of the SOI layer exposed in the deep trench, wherein a bottommost surface of the non-conformal dielectric layer in the deep trench is located above an interface between the buried oxide layer and the base substrate; and enlarging a diameter or width of the lower portion of the deep trench by etching the base substrate selective to the non-conformal dielectric layer and the buried oxide layer to form a bottle shaped trench.

9. The method of claim 8, wherein enlarging the diameter or width of the lower portion of the deep trench is performed sequentially following depositing the non-conformal dielectric layer, the non-conformal dielectric layer masking or protecting the SOI layer during enlarging of the diameter or width of the lower portion of the deep trench.

10. The method of claim 8, wherein a reaction time of the high temperature high pressure chemical vapor deposition technique used to deposit the non-conformal dielectric layer does not exceed 40 seconds.

11. The method of claim 8, wherein the deep trench comprises a width or diameter less than about 55 nm.

12. The method of claim 8, further comprising:
forming a buried capacitor plate in the base substrate by introducing dopant through a sidewall and a bottom surface of the lower portion of the bottle shaped trench;
forming a node dielectric by conformally depositing a dielectric material along an entire sidewall of the bottle shaped trench and the bottom surface of the bottle shaped trench; and
forming an inner electrode directly on top of the node dielectric substantially filling the bottle shaped deep trench.

13. The method of claim 8, further comprising:
forming a buried capacitor plate in the base substrate by introducing dopant of a second conductivity type through a sidewall and a bottom surface of the lower portion of the bottle shaped trench;
forming a node dielectric by conformally depositing a dielectric material along an entire sidewall of the bottle shaped trench and the bottom surface of the bottle shaped trench;
forming an inner electrode directly on top of the node dielectric substantially filling the bottle shaped trench; and
forming a buried strap to electrically connect an inner electrode of the deep trench capacitor with a source region of a nearby transistor.

14. The method of claim 8, further comprising:
forming a deep trench capacitor within the deep trench; and
forming a buried strap to electrically connect an inner electrode of the deep trench capacitor with a source region of a nearby transistor.

15. A method comprising:
forming a deep trench in a semiconductor-on-insulator substrate comprising an SOI layer directly on top of a buried oxide layer directly on top of a base substrate, the deep trench comprising an upper portion aligned with the SOI layer and the buried oxide layer, and a lower portion aligned with the base substrate;

depositing, anisotropically, a non-conformal dielectric layer directly on top of the semiconductor-on-insulator substrate using a high temperature high pressure chemical vapor deposition technique, wherein the high temperature high pressure chemical vapor deposition technique comprises a reaction temperature of at least 700° C., a pressure above atmospheric pressure, and a deposition reaction time no greater than 40 seconds, the non-conformal dielectric layer only covering an entirety of a sidewall of the SOI layer exposed in the deep trench, wherein a bottommost surface of the non-conformal dielectric layer in the deep trench is located above an interface between the buried oxide layer and the base substrate; and forming a bottle shaped trench by etching the base substrate exposed in the lower portion of the deep trench selective to the non-conformal dielectric layer and the buried oxide layer.

16. The method of claim 15, wherein forming the bottle shaped trench is performed sequentially following depositing the non-conformal dielectric layer, the non-conformal dielectric layer masking or protecting the SOI layer during forming of the bottle shaped trench.

17. The method of claim 15, wherein the deep trench comprises a width or diameter less than about 55 nm.

18. The method of claim 15, further comprising:
forming a buried capacitor plate in the base substrate by introducing dopant through a sidewall and a bottom surface of the lower portion of the bottle shaped trench;
forming a node dielectric by conformally depositing a dielectric material along an entire sidewall of the bottle shaped trench and the bottom surface of the bottle shaped trench; and
forming an inner electrode directly on top of the node dielectric substantially filling the bottle shaped deep trench.

19. The method of claim 15, further comprising:
forming a buried capacitor plate in the base substrate by introducing dopant of a second conductivity type through a sidewall and a bottom surface of the lower portion of the bottle shaped trench;
forming a node dielectric by conformally depositing a dielectric material along an entire sidewall of the bottle shaped trench and the bottom surface of the bottle shaped trench;
forming an inner electrode directly on top of the node dielectric substantially filling the bottle shaped trench; and
forming a buried strap to electrically connect an inner electrode of the deep trench capacitor with a source region of a nearby transistor.

20. The method of claim 15, further comprising:
forming a deep trench capacitor within the deep trench; and
forming a buried strap to electrically connect an inner electrode of the deep trench capacitor with a source region of a nearby transistor.

* * * * *